United States Patent [19]

Hosten

[11] Patent Number: 4,948,486
[45] Date of Patent: Aug. 14, 1990

[54] ELECTROPLATING APPARATUS FOR PLATE-SHAPED WORKPIECES, PARTICULARLY PRINTED CIRCUIT BOARDS

[75] Inventor: Daniel Hosten, Handzame, Belgium

[73] Assignee: Siemens Aktiengesellschaft, Berlin and Munich, Fed. Rep. of Germany

[21] Appl. No.: 394,536

[22] Filed: Aug. 16, 1989

[30] Foreign Application Priority Data

Sep. 1, 1988 [DE] Fed. Rep. of Germany ....... 3829763

[51] Int. Cl.⁵ ............................................. C25D 17/00
[52] U.S. Cl. .................................................... 204/198
[58] Field of Search ............................... 204/198, 202

[56] References Cited

U.S. PATENT DOCUMENTS 4,385,967  5/1983  Brady et al. ........................... 204/27
4,755,271  7/1988  Hosten ................................. 204/198
4,776,939 10/1988  Bläsing et al. ....................... 204/202

Primary Examiner—T. M. Tufariello
Attorney, Agent, or Firm—Hill, Van Santen, Steadman & Simpson

[57] ABSTRACT

An electroplating apparatus for plate-shaped workpieces which are conveyed in a horizontal path through an electrolytic cell characterized by the edges of the workpieces being grasped via contact elements that are secured on an endless circular flexible metal band. The side face of the metal band facing toward the workpiece glides above and below the conveyor and contact elements on guide and seal elements that extend in the wall of the cell along the horizontal direction. The metal band and conveyor and contact elements simultaneously have the job of conveying the workpiece, of cathodic contacting of the workpiece and of sealing an electroplating cell against the emergence of electrolyte solution.

10 Claims, 1 Drawing Sheet

ELECTROPLATING APPARATUS FOR PLATE-SHAPED WORKPIECES, PARTICULARLY PRINTED CIRCUIT BOARDS

RELATED APPLICATIONS

The present application is related in subject matter to my copending U.S. application Ser. No. 394,472, filed Aug. 16, 1989, and to my copending U.S. application Ser. No. 394,725, filed Aug. 16, 1989.

BACKGROUND OF THE INVENTION

The present invention is directed to an electroplating apparatus for a plate-shaped workpiece, particularly a printed circuit board, which is treated as it is moved in a horizontal direction through a bath of electrolyte solution, which includes at least one endless drive arranged laterally to the path along the edge of the workpiece forming both a conveyor means and having contacting elements for seizing the lateral edge of the workpiece and moving it in a throughput direction along the path.

An electroplating apparatus is disclosed in U.S. Pat. No. 4,755,271, whose disclosure is incorporated by reference thereto and which was based on the same German Application as European Patent Application No. 0 254 962. In this patent, forceps-shaped contact clamps are provided as a conveyor and contacting elements in an electroplating apparatus. These contact clamps are secured to an endlessly circulating chain or to an endlessly circulating toothed belt and seize the lateral edges of the workpiece. In addition to providing a cathodic contacting of the workpiece, these forceps-shaped contact clamps simultaneously also serve as dogs of a conveyor means for the horizontal passage of the workpiece through the electroplating solution. Means, that effect the grasping of the lateral edge of the workpiece by the contact clamps, are positioned adjacent the beginning of the path and means, which cause the releasing of the workpiece by the contact clamps, are provided at the end of the conveying path of the plate-shaped workpieces. The contact clamps are shielded from the contact with electrolyte solution by a seal extending laterally along the throughput direction and path, which seals press resiliently against the respective workpieces.

SUMMARY OF THE INVENTION

In an electroplating apparatus of the above type species, an object of the invention is to further reduce the structural outlay and cost for the cathodic contacting and for the conveying of the plate-shaped workpieces.

For achieving these objects, the present invention is directed to an improvement in an electroplating apparatus for plate-shaped workpieces, particularly printed circuit boards, which are moved through a chamber containing electrolyte in a longitudinal path, said apparatus including at least one endless drive means being arranged laterally relative to the container and the throughput path, said endless drive means carrying the conveyor and contacting elements that grasp a lateral edge of the workpiece and are movable in the throughput direction. The improvements are that the conveyor and contact elements are secured to an endless circulating flexible metal band, whose lateral surface facing toward the workpiece slides above and below the conveyor and contacting elements on guide and seal elements provided in the container, which extend the length of the throughput direction.

In the electroplating apparatus of the invention, the endless circulating flexible and additionally assumes the function of a seal of the electroplating cell in addition to the function as a conveyor means for the workpiece and as contacting mechanism for the workpiece. Due to this additional sealing function of the metal band, the static seals that were heretofore standard can be eliminated so that an extremely and economical structure occurs overall. A further critical advantage of the electroplating apparatus of the invention may be seen wherein the desired thickness of the metal layer can already be achieved at a slight distance of about 10 mm from the edge of the plate-shaped workpiece.

According to a preferred development of the invention, it is provided that at least one respective endless drive is arranged on each side of the throughput path. A significant, more reliable conveying of the plate-shaped workpieces through the electroplating solution with a considerably improved cathodic contact of the workpiece and, additionally, a both-sided seal of the electroplating cell occurs as a result of this preferred structure.

When perforations are introduced into the metal band, then the drive and guidance of the endless metal band can be undertaken in a proven fashion, as in the case of film strips and the like.

It has also proven advantageous when the metal band is composed of titanium. In addition to its high resistance to corrosion, it is also distinguished by its high flexibility and that it enables a durable employment as an endless drive belt.

It is provided in a preferred development of the electroplating apparatus of the invention that a plurality of contact spring pairs, which are secured on the metal band at a distance from one another, are provided as conveyor and contacting elements. The lateral edges of the workpiece are resiliently accepted between these contact springs that lie opposite to one another. Such a contact spring arrangement in pairs guarantees a reliable cathodic contacting of the workpieces and a reliable conveying of the workpieces through the electroplating solution. Means that were intended to effect the grasping of the lateral edges of the workpiece or, respectively, the release of the workpiece, are not required, given the utilization of the contacting springs arranged in pairs.

It has proven advantageous for the supplying of cathode current to the metal band when a live rail that carries contact means for the wiper contacts of the metal band is arranged on a side of the metal band lying opposite the workpiece. Leave springs or brushes can, thereby, be utilized as contact means for wiper contacting of the metal band. Moreover, it has proven beneficial when the live rail is composed of titanium-cladded copper conductors, since the copper conductor therein can conduct extremely high currents, whereas the titanium cladding guarantees a high resistance to corrosion of the live rail.

According to further preferred developments of the invention, it is provided that the guide and seal elements are integrated in the side walls of the electroplating cell or container. An especially compact structure of the electroplating cell can be realized as a result thereof. Moreover, the conveyor and/or contacting elements in this case can also be shielded by an isolating wall arranged at the inside of the face wall. Undesirable metal depositions on the conveyor and contacting elements can at least largely be prevented with such an insulating wall.

Other advantages and features of the invention will be readily apparent from the following description of the preferred embodiments, the drawings and claims.

DESCRIPTION OF THE PREFERRED EMBODIMENTS

The principles of the present invention are particularly useful when incorporated in an electroplating cell, generally indicated at Gz, which cell accepts an electrolyte solution and through which a printed circuit board Lp is transported in a direction of arrow Pf1 in a horizontal path. A horizontally aligned, upper anode Ao, that is composed of a basket Kb of expanded metal and of spherical anode materials Am contained therein, is situated at a slight distance above the throughput path of the printed circuit boards Lp, which is identified by the arrow Pf1. A lower anode Au that consists of a sieve-shaped plate Pl of expanded metal and anode materials Am situated therebelow is positioned in a horizontal plane at a slight distance under the throughput path.

An upper covering Ad and a side wall Sw of the cell Gz may be seen, and the side wall Sw is provided with a horizontal slot Sz at the level of the throughput path of the printed circuit board Lp. A respective guide and seal element FAE, that extends in the throughput direction Pf1 and has an L-shaped cross section, is integrated in the side wall Sw above and below the throughput path in the region of this slot Sz. A metal band Mb, which has a rectangular cross section, glides on the vertical legs of the guide and seal elements FAE that, for example, are composed of high-molecular polyethylene. The metal band Mb, first, thereby guides and, secondly, seals the slot Sz and prevents the emergence of electrolyte solution from the electroplating cell Gz.

Figure 2:
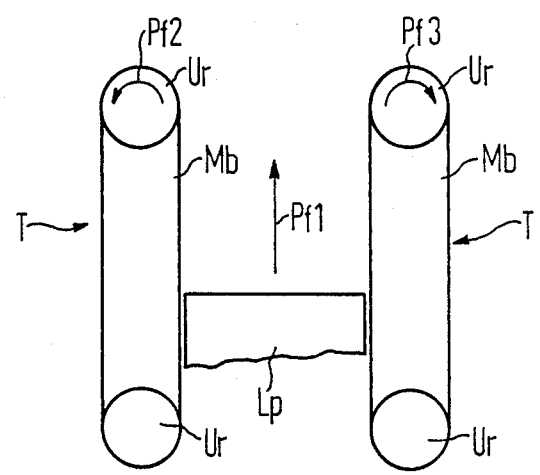
FIG. 2 is a schematic arrangement of the endless circulating metal bands that serve as carriers for the conveyor and contacting elements displaceable together with the printed circuit board and electroplating apparatus shown in FIG. 1.

As illustrated in FIG. 2, the above-mentioned metal bands Mb are guided over a pair of deflection rollers Ur and form an endless drive T. It may also be seen in FIG. 2 that the respective endless drive T is arranged at both sides of the throughput path Pf1 of the printed circuit boards Lp and that respective deflection rolls Ur are driven in the direction of arrows Pf2 and Pf3, respectively. The drive direction of the inner runs or sides of the endless drives T thereby correspond to the throughput direction Pf1 of the printed circuit board Lp.

Figure 1:
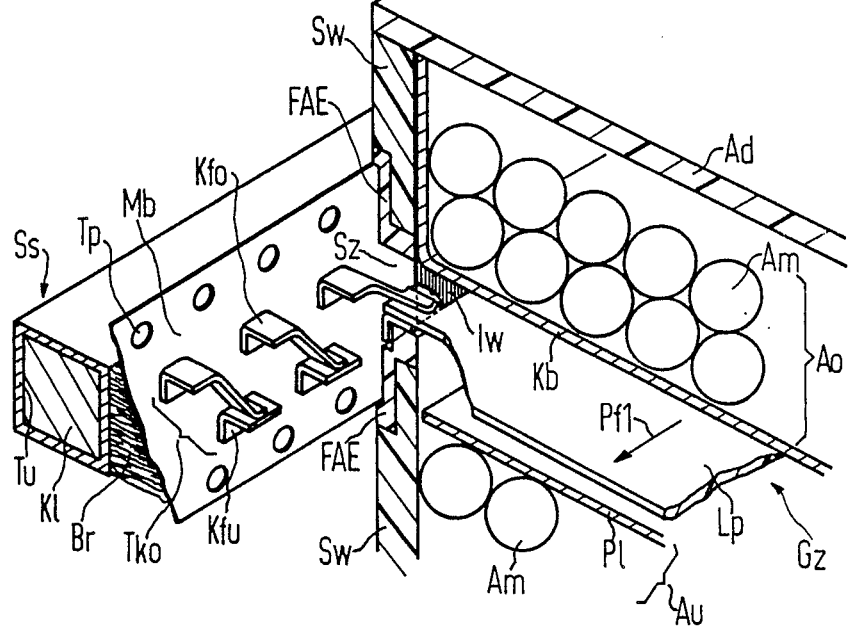
FIG. 1 is a perspective view with portions broken away for purposes of illustration of an electroplating apparatus for printed circuit boards that are moved in a horizontal path in accordance with the present invention.

As illustrated in FIG. 1, the metal band Mb is, respectively, provided with conveying perforations Tp along a top edge and a bottom edge and carries conveyor and contacting elements Tko, respectively, which are composed of an upper contact spring Kfo and a lower contact spring Kfu, which resiliently accept the lateral edges of the printed circuit board Lp in the region of the slot Sz. These contact springs serve as dogs for conveying the printed circuit board Lp through the electroplating cell Gz. The conveyor and contacting elements Tko, however, also simultaneously enable a reliable cathodic contacting of the printed circuit boards Lp, whereby the cathode current is supplied to the back side of the metal band Mb via a stationary live rail Ss and brushes Br, which are secured thereto. The live rail Ss is composed of a solid copper conductor K1 that is protected against the attack of corrosion by a titanium cladding Tu. The brushes Br, for example, are composed of copper, whereas titanium has proven itself as the material for the metal band Mb and for the contact springs Kfo and Kfu.

An isolating wall Iw is attached to the inside of the side wall Sw in the region of the slot Sz. This isolating wall Iw, in particular, shields the upper contact spring Kfo guided along in the slot Sz and prevents the deterioration of the cathodic contacting of the printed circuit board Lp due to undesirable metal depositions onto the contact surfaces.

Further details concerning the through-contacting and electroplating of printed circuit boards Lp in a horizontal path system are known in the art, for example as disclosed in the abovementioned European Application or as disclosed in U.S. Pat. No. 4,755,271, whose disclosure has been incorporated by reference thereto.

Although various minor modifications may be suggested by those versed in the art, it should be understood that I wish to embody within the scope of the patent granted hereon all such modifications as reasonably and properly come within the scope of my contribution to the art.

I claim:

1. In an electroplating apparatus for plate-shaped workpieces, which are to be treated as they move in a horizontal path through an electrolytic cell, said apparatus having at least one endless drive arranged laterally from the throughput path, said endless drive carrying conveyor and contacting elements for grasping a lateral edge of the workpiece and to move the workpiece in the throughput direction, the improvements comprising the conveying contact elements being secured to an endless circulating flexible metal band whose lateral surface facing toward the workpiece glides above and below the conveyor and contacting elements on guide and seal elements that extend in a direction of the throughput path.

2. In an electroplating apparatus according to claim 1, wherein at least, respectively, one endless drive is arranged on each side of the throughput path.

3. In an electroplating apparatus according to claim 2, wherein a conveyor perforation is introduced into each of the metal bands of the metal drives.

4. In an electroplating apparatus according to claim 1, wherein the metal band is composed of titanium.

5. In an electroplating apparatus according to claim 1, wherein a plurality of contact spring pairs secured to the metal band at a distance from one another are provided as the conveyor and contacting elements, the lateral edges of the workpiece being resiliently accepted between said contact springs which lie opposite one another.

6. In an electroplating apparatus according to claim 1, which includes a live rail that carries contact means for wiping contact of the metal band, said live rail being arranged on a side of the metal band lying opposite the workpiece.

7. In an electroplating apparatus according to claim 6, wherein the live rail is composed of a titanium-cladded copper conductor.

8. In an electroplating apparatus according to claim 1, wherein the guide and seal elements are integrated in a side wall of the electroplating cell.

9. In an electroplating apparatus according to claim 8, wherein the conveyor and contact elements are shielded by an isolating wall arranged at the side of the side wall of said cell.

10. In an electroplating apparatus according to claim 1, wherein the metal band has conveying perforations provided along at least one of said edges.

* * * * *